United States Patent [19]

Hill et al.

[11] 4,293,755

[45] Oct. 6, 1981

[54] METHOD OF COOLING INDUCTION-HEATED VAPOR DEPOSITION APPARATUS AND COOLING APPARATUS THEREFOR

[75] Inventors: Lawrence Hill, Short Hills; Dennis Garbis, Dix Hills; Robert Heller, Levittown, all of N.Y.

[73] Assignee: General Instrument Corporation, Clifton, N.J.

[21] Appl. No.: 140,293

[22] Filed: Apr. 14, 1980

Related U.S. Application Data

[63] Continuation of Ser. No. 953,575, Oct. 23, 1978, abandoned.

[51] Int. Cl.³ .......................... H05B 6/42; C23C 13/08
[52] U.S. Cl. ........................... 219/10.41; 219/10.49 R; 219/10.43; 118/50.1; 427/45.1; 336/61
[58] Field of Search .......... 219/10.41, 10.43, 10.49 R, 219/10.79, 10.51, 10.57; 174/15 R; 361/385; 336/57, 58, 61; 338/55; 165/104 M; 118/50.1, 620; 427/45.1

[56] References Cited

U.S. PATENT DOCUMENTS

| Re. 29,016 | 10/1976 | Peacock | 219/9.5 |
|---|---|---|---|
| 3,067,278 | 12/1962 | Albright | 174/15 R |
| 3,301,213 | 1/1967 | Grochowski et al. | 219/10.43 |
| 3,384,162 | 5/1968 | Chan | 174/15 R |
| 3,551,115 | 12/1970 | Jamieson et al. | 219/10.49 |
| 3,705,967 | 12/1972 | Bobart et al. | 219/10.41 |

Primary Examiner—Gene Z. Rubinson
Assistant Examiner—Philip H. Leung
Attorney, Agent, or Firm—James & Franklin

[57] ABSTRACT

A method of cooling induction-heated vapor deposition apparatus including an electrically grounded deposition enclosure and a RF induction heating coil having essentially electrically uninsulated turns thereof disposed about the deposition enclosure, comprises the step of spraying deionized liquid having a resistivity of at least 14 megohms-cm directly onto the apparatus.

2 Claims, 3 Drawing Figures

METHOD OF COOLING INDUCTION-HEATED VAPOR DEPOSITION APPARATUS AND COOLING APPARATUS THEREFOR

This is a continuation of application Ser. No. 953,575, filed Oct. 23, 1978, now abandoned.

BACKGROUND OF THE INVENTION

The present invention relates to methods of cooling, and in particular to a method of cooling an induction-heated vapor deposition apparatus.

Induction-heated vapor deposition apparatus typically includes a deposition enclosure (such as a epitaxial quartz tube or a bell jar) having disposed therein a susceptor-supported wafer and disposed thereabout the essentially electrically uninsulated turns of an RF induction heating coil. As current is passed through the coil turns, the coil induces heating of the susceptor to a temperature (at least 500° C.) sufficient to cause the gas passing through the deposition enclosure to deposit epitaxially on a wafer.

Unfortunately, as the susceptor heats the wafer, it also heats the deposition enclosure, thereby promoting the deposit of the gases passing through the deposition enclosure upon the interior walls of the deposition enclosure. Such deposits on the interior walls of the deposition enclosure have a deleterious effect on the quality of the material being grown within the deposition enclosure, promoting the development of spikes, pits and various other surface defects. Such deposits may furthermore include dopants from a given run, in which case the deposits may act in future consecutive runs as an unwanted source of the dopants. In order to remove these deposits once they have formed, the deposition enclosure must be taken off stream for cleaning, thereby lowering the productivity of the deposition apparatus.

In order to prevent such deposits from forming, it is customary to cool the deposition enclosure by any of a variety of known techniques. For example, air, nitrogen or other gases may be directed in a cooling stream onto the exterior of the deposition enclosure to absorb and remove heat therefrom. A water jacket may be disposed about the deposition enclosure, the water flowing therethrough acting to absorb and remove heat from the exterior surface of the deposition enclosure. The deposition enclosure may be at least partially surrounded by a black box which absorbs radiant heat from the exterior surface of the deposition enclosure. An exhaust system such as a shroud-encompassing tube may be used to remove heat from the immediate vicinity of the exterior surface of the deposition enclosure. However, none of the known cooling techniques provide sufficient cooling without unduly increasing the capital and operating costs of the system (for example, by requiring expensive gas cooling, heat exchangers, exhaust ducts and the like).

To fully comprehend the complexity of the problem, it must be appreciated that the cooling technique used must not only avoid any possibility of a short circuit between the ends of the RF coil (a typical voltage differential of about 16 kilovolts exists at this point), but also even a short circuit between adjacent turns of the RF coil or from one turn to ground. There is a basic matching between the oscillator circuit of the RF induction source (that is, the generator) and the coil induction frequency of the susceptor within the deposition enclosure. Any frequency change from the normal (typically about 4.5 megahertz, but dependent upon the equipment used) due to mismatching as a result of minimal shorting or grounding of coil turns, even within the one millivolt range, results in a loss of tuning of the oscillator and thus an effective loss of power.

Accordingly, it is an object of the present invention to provide a method for cooling an induction-heated vapor deposition apparatus which is both economical and efficient.

Another object is to provide such a method which is safe and easy to operate.

A further object is to provide apparatus for use in such a cooling method.

SUMMARY OF THE INVENTION

It has now been found that the above and related objects of the present invention are obtained in a cooling method comprising the use of deionized water sprayed directly onto the vapor deposition apparatus. Whereas it has heretofore been generally considered by those skilled in the art that the high operating potential of the RF coil (up to 16 kilovolts or even higher) would render the use of direct water cooling techniques extremely hazardous to workers in the vincinity, it has now been found that deionized water having a resistivity of at least 14 megohms-centimeter may be safely used in such a cooling process. The deionization of the water increases its resistivity to a point where a spray thereof may be safely employed in the process. The deionization of the water further avoids the deposition of minerals on the exterior surface of the deposition enclosure as the water spray is evaporated, thereby minimizing the formation of undesirable local deposits which would affect the temperature profile being maintained within the deposition enclosure and eventually require removal.

More specifically, the present invention concerns a method of cooling induction—heated vapor deposition apparatus including an electrically grounded deposition enclosure and an RF induction heating coil having essentially electrically uninsulated turns thereof disposed about the deposition enclosure. The method comprises the step of spraying deionized liquid having a resistivity of at least 14 megohms-centimeter directly onto the apparatus.

The deionized liquid is preferably deionized water, typically at room temperature. The deionized liquid is generally sprayed directly onto the deposition enclosure and the coil turns, preferably onto the top of the apparatus. The deionized liquid is preferably sprayed in a volumetric pattern such that hotter parts of the deposition enclosure receive greater volumes of the deionized liquid than cooler parts thereof.

In a preferred embodiment of the present invention, the apparatus is disposed over a receptacle adapted to receive fluid and end portions of the coil are passed through the bottom of the receptacle, the end portions being electrically isolated from the receptacle and any liquid contents thereof. The coil end portions are preferably encapsulated in polytetrafluoroethylene to electrically isolate the coil end portions.

Another aspect of the present invention concerns an improvement in apparatus suitable for use in cooling such induction-heated vapor deposition apparatus and comprises means positioned in a location having access to the deposition enclosure for spraying such deionized liquid directly onto the enclosure and means for collecting the sprayed liquid.

Preferably, the collecting means comprises a receptacle adapted to receive liquid, and the deposition apparatus is disposed above the bottom of the receptacle with end portions of the coil passing through the bottom of the receptacle, the end portions being electrically isolated from the receptacle and the liquid contents thereof. The spray means, the collecting means and the coil end portions are preferably independently grounded.

DETAILED DESCRIPTION OF PREFERRED EMBODIMENTS

Figure 1:
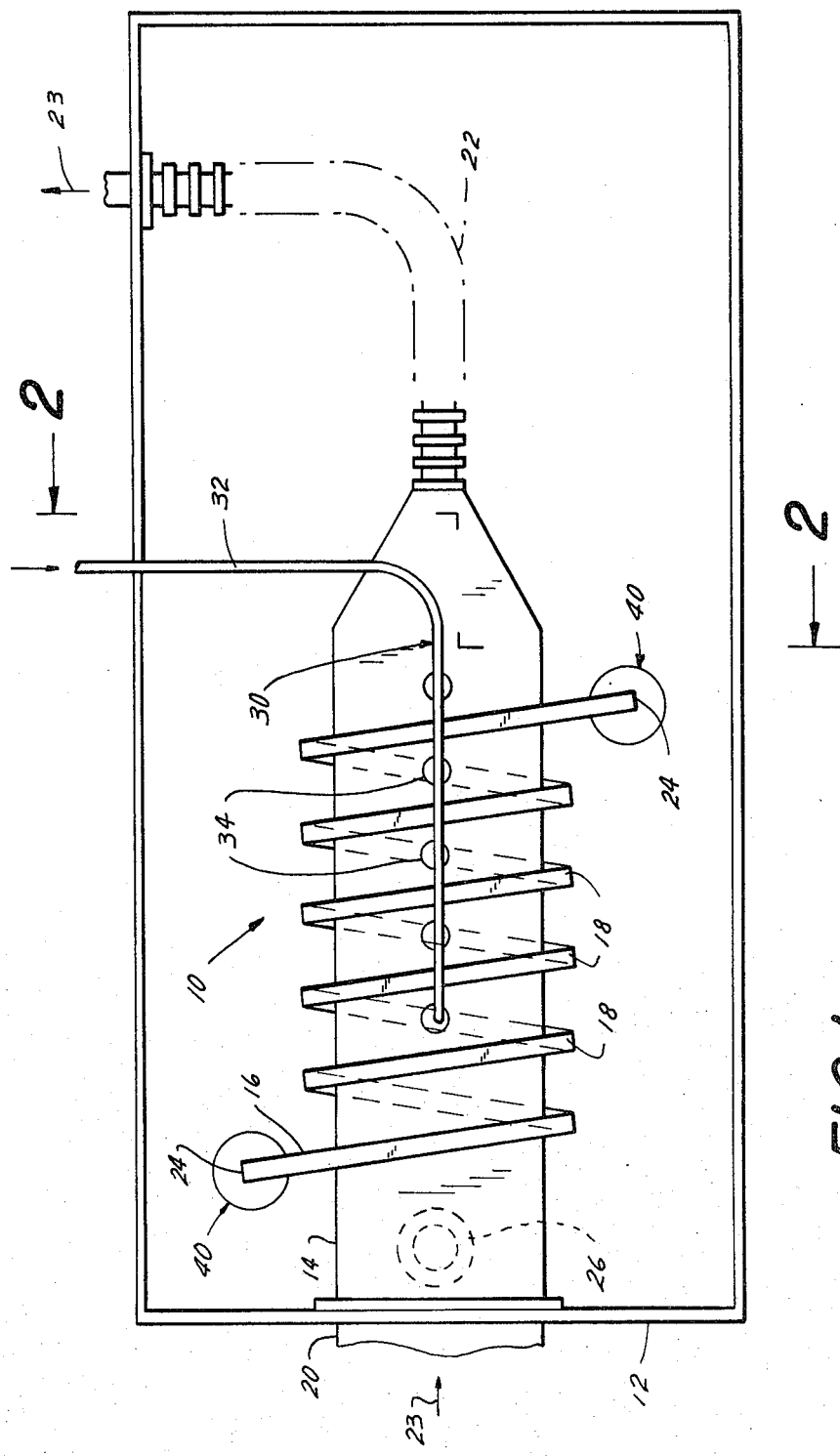
FIG. 1 is a fragmentary top plan view of apparatus useful in the method of the present invention.
Figure 2:
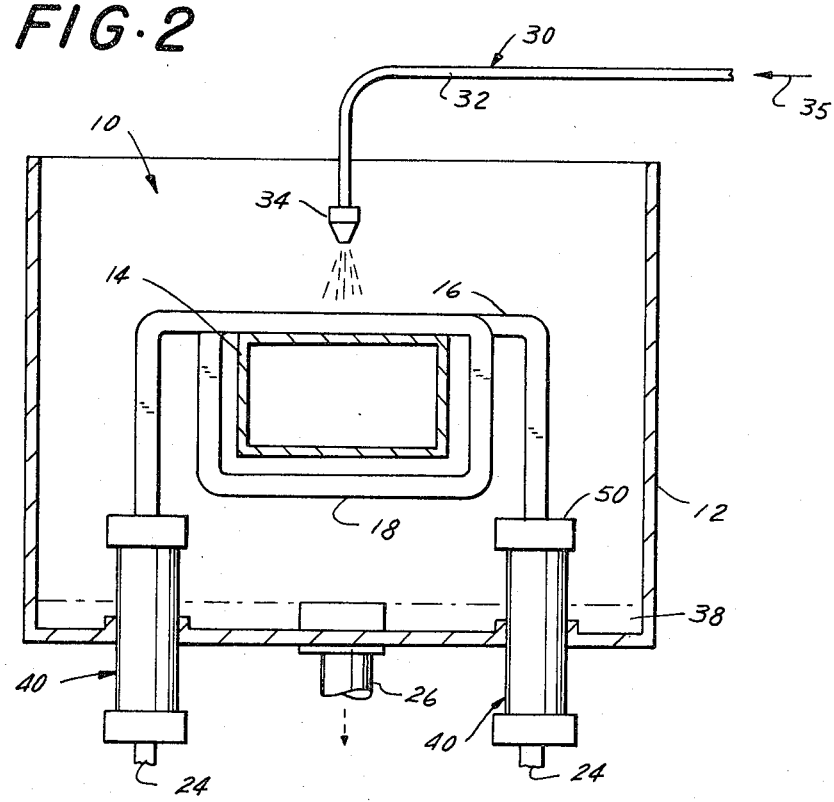
FIG. 2 is a fragmentary side elevation view, partially in cross-section, taken along the line 2—2 of FIG. 1.

Referring now to the drawing, and in particular to FIGS. 1 and 2 thereof, therein illustrated is induction-heated vapor deposition apparatus, generally designated 10. The apparatus 10 is mounted in an open-topped receptacle 12 or pan adapted for the receipt of fluid and includes a deposition enclosure 14 (e.g., a horizontal quartz epitaxy tube) and an internally water cooled RF induction heating coil 16 having turns 18 thereof disposed about the deposition enclosure 12. As is conventional in such apparatus, an inlet conduit 20 is provided to feed the gases necessary for crystal growth to the inlet end of the deposition chamber 14 while an outlet conduit 22 is connected to the outlet end of the deposition enclosure 14 to remove unused gases, the gases flowing in the direction of arrows 23. Appropriate spacers (not shown) formed of an electrically insulative material are employed to maintain the spacing of the coil turns 18. One end 24 of the RF induction coil 16 is secured to an RF induction source such as a generator (not shown), and the other end 24 is connected to ground. Disposed within the deposition enclosure 14 is a stepped susceptor (not shown) tuned to the oscillator circuit of the generator. As all of the above elements (with the exception of the pan 12) are conventional in induction-heated vapor deposition apparatus, they will not be described herein in further detail.

Turning now to the novel aspects of the present invention, the conventional apparatus 10 is disposed intermediate the top and bottom of the pan 12, the bottom of coil turns 18 being preferably about 7 inches above the pan bottom, with the gas inlet 20 and gas outlet 22 passing through the pan sidewalls. The pan 12 is preferably mounted in an electrically grounded frame (not shown) and is provided with an electrically insulated drain 26 which maintains the level of fluid in the pan 12 at about one inch above the pan bottom, for reasons to be explained hereinafter, and discharges the excess to waste.

A sprayer system generally designated 30 is disposed above the deposition apparatus 10, the sprayer system 30 comprising a liquid conduit 32 having a plurality of nozzles 34 disposed thereon and adapted to spray with liquid the top of the apparatus, and more particularly the deposition enclosure 14 and coil turns 18. The sprayer system 30 is connected to a source of deionized liquid, preferably deionized water, having a resistivity of at least 14 meghoms-cm (not shown), the source being adapted to introduce the deionized fluid of given resistivity through the conduit 32 and hence through the spray nozzles 34 onto the apparatus 10. The requirement that the deionized liquid have a resistivity of at least 14 megohms-centimeter, preferably 14–18 megohms-cm, is based on the assumption that the path of the dispensed deionized fluid along the deposition enclosure and the RF coil is uncontrollable and at one time or another the dispensed spray may constitute an electrical path exposed to the full power of the RF source (in the present case, about 16 kilovolts). The deionized (i.e., demineralized) nature of the fluid being sprayed onto the deposition apparatus precludes the formation on the outer walls thereof of mineral deposits which might effect local cooling and eventually require shutdown of the apparatus for deposit removal. The sprayer system 30 is, of course, composed of materials not adversely affecting the deionized nature or high resistivity level of the fluid passing therethrough in the direction of arrow 35. Inasmuch as the ends 24 of the RF coil 16 pass through the bottom of the receptacle 12 and there will be a shallow reservoir of fluid 38 lying atop the bottom of the pan (see FIG. 2), each end 24 of the RF coil is shielded from the pan 12 (and the fluid therein) by an isolator assembly generally designated 40.

Figure 3:
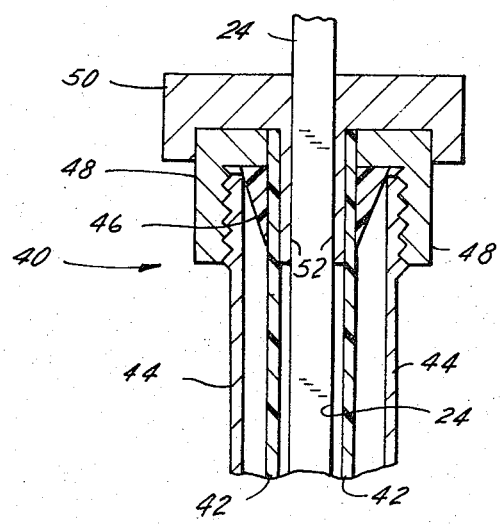
FIG. 3 is a fragmentary enlarged side elevation view, partially in cross-section, of an encapsulated end portion of the RF coil.

Referring now in particular to FIG. 3, each isolator assembly 40 comprises a pair of coaxial tubes, an inner tube 42 of Teflon (DuPont's registered trademark for polytetrafluorethylene) and an outer tube 44 of aluminum externally threaded at each end thereof. A Teflon grommet 46 is disposed intermediate the tubes 42, 44 at each end thereof, while an aluminum nut 48 is threaded onto the ends of the outer aluminum tube 44 to mechanically lock the grommet 46 with the tubes 42, 44. A Teflon bushing 50 is fitted over the outer end of each aluminum nut 48 and has an inner flange 52 extending downwardly intermediate the coil end 24 and the inner tube 42, thereby to seal the coil end 24 against exposure to the fluid in the reservoir. The top of the isolator assembly 40 (that is, the top of the bushing 50) extends approximately three inches above the pan bottom, and hence about 2 inches above the level of the fluid in the reservoir. The presence of the fluid in the reservoir assists in keeping the pan 12 cool, and thus also the Teflon portions of the isolator assembly 40 passing therethrough (which might otherwise crack), while the disposition of the top of the isolator assembly 40 above the level of the fluid in the reservoir minimizes the possibility of the fluid in the reservoir providing a direct electrical path between the two coil ends 24.

The minimum thickness of the inner sleeve 42 of the isolator assembly 40 is dependent upon the type of material employed. Polytetrafluoroethylene has a dielectric capacity of 1 kilovolt per mil of thickness so that an interior sleeve thickness of 0.060 inches more than suffices for power applications involving up to 16 kilovolts. Polytetrafluoroethylene is a preferred plastic for use in the isolator assembly 40 because of its known ability to withstand high temperatures without melting, its insulating properties, its easy machinability, its nonporous nature, and its ability to accommodate temperature differentials without cracking.

It will be appreciated that the isolator assemblies 40 utilized on the ends 24 of the RF coil are required only because the ends pass directly through the pool of fluid lying at the bottom of the pan 12. If the RF coil ends 24 are taken out of the pan 12 through the sides thereof (rather than the bottom) and above the level of the accumulated fluid therein, the isolator assemblies 40 may be dispensed with entirely.

While the deionized fluid may also be directed by nozzles 34 at the sides and bottom of the deposition enclosure 14 (provided that the pan 12 is of sufficient height to insure collection of the dispensed spray), it is the top of the deposition enclosure 10 which is normally the hottest and which therefore requires the maximum amount of cooling. Where a stepped susceptor is employed to insure uniform deposition, the spacing of the nozzles 34 may be varied (e.g. by bunching the nozzles at the hot end of the deposition apparatus, as shown in FIG. 1) or the volumetric capacity of particular nozzles 34 may be varied to insure that the hotter parts of the deposition enclosure receive greater volumes of deionized liquid than the cooler parts thereof.

The requisite resistivity of the fluid, the fluid volume rate utilized, the angle of spray and the spray pattern to be employed will all vary with the individual application and be dependent upon such factors such as the amount of cooling desired (as defined by the RF source power available and the tendency of the gases to condense onto the deposition enclosure walls), the area of the deposition enclosure, the RF power range employed, the susceptor temperature selection and profile, etc. For a given application involving the deposition from chlorosilane gas with an RF power range up to 16 killovolts and a susceptor temperature of at least 500° C., generally 1000°–1200° C., the following are suitable parameters:

Water resistivity: 14–18 megohms-centimeter

Nozzle spray angle: 80–90 degrees

Nozzle spray pattern: solid cone

Nozzle volume for total system: 0.052 gallons per minute at 30 psig

Nozzle spacing: for 8 inch tube, 8 inch center-to-center spacing

Inner sleeve thickness of isolator assembly: 0.060 inch

While the method described is suitable for use in operations requiring minimal amounts of deionized fluid, where larger amounts are needed it will be economical to collect, cool and recycle the spent deionized fluid rather than merely discharging the same to waste.

As safety precautions, the drain 26, the pan 12, the deposition enclosure 14, and even the fluid conduit 32 should be independently grounded. Furthermore, the walls of the pan 12 should be of sufficient height to preclude the sprayed liquid from splashing off the deposition enclosure and out of the pan 12.

While the object of the present invention is a cooling method, it will be appreciated that precautions must also be taken to insure against overcooling of the deposition enclosure, and in particular local overcooling thereof. To this end, the deionized fluid is preferably at or about room temperature, and the nozzles 34 are sufficiently spaced apart to minimize spray overlap. On the other hand, where a single row of nozzles 34 extending along the length of the deposition enclosure 14 is unable to provide sufficient cooling because of the width of the deposition enclosure 14, a plurality of parallel rows of nozzles 34 may be used.

Because the present invention allows the walls of the deposition enclosure to be easily and economically cooled, thereby reducing deposition on the inner walls of the deposition enclosure, the quality of the epitaxial crystal deposited is improved (by minimizing spikes, pits, and surface defects) while at the same time tube maintenance is minimized, contamination of future runs by absorbed dopant is minimized, and operating costs are reduced because gas cooling, water jackets, black boxes and exhaust systems are not required. Thus the present invention provides a cooling process which is economical, efficient, safe and easy to operate.

Now that the preferred embodiments of the present invention have been shown and described in detail, various modifications and improvements thereon will become readily apparent to those skilled in the art. Accordingly, the spirit and scope of the present invention is to be limited only by the appended claims, and not to the foregoing disclosure.

We claim:

1. A method of cooling induction-heated horizontal epitaxy tube vapor deposition apparatus including an electrically grounded deposition enclosure and an RF induction heating coil having essentially electrically uninsulated turns thereof disposed about said deposition enclosure, comprising the step of spraying deionized liquid having a resistivity of at least 14 megohms-centimeter directly onto said deposition enclosure and said coil turns of said apparatus in a pattern such that hotter parts of said deposition enclosure receive greater volumes of said deionized liquid than cooler parts thereof.

2. In apparatus for cooling induction-heated horizontal epitaxy tube vapor deposition apparatus including an electrically grounded deposition enclosure and an RF induction heating coil having essentially electrically uninsulated turns thereof disposed about said deposition enclosure, the improvement comprising (a) means positioned in a location having access to said enclosure for spraying deionized liquid having a resistivity of at least 14 megohms-centimeter directly onto said enclosure and said coil turns of said apparatus, said spray means being so arranged as to spray said deionized liquid in a pattern such that hotter parts of said deposition enclosure receive greater volumes of said deionized liquid than cooler parts thereof;

(b) means for collecting the sprayed liquid, said collecting means comprising a receptacle adapted to receive liquid, and said deposition apparatus being disposed above the bottom of said receptacle with end portions of said coil passing through the bottom of said receptacle, said end portions being grounded and encapsulated in polytetrafluoroethylene to electrically isolate said coil end portions from said receptacle and the liquid contents thereof;

(c) means for maintaining within said receptacle a liquid level below the top of said encapsulated coil end portions but above the bottom of said receptacle; and (d) means for independently grounding said spray means and said collecting means.

* * * * *